United States Patent
Lee et al.

(10) Patent No.: US 9,368,745 B2
(45) Date of Patent: Jun. 14, 2016

(54) ORGANIC LIGHT-EMITTING DIODE DISPLAY APPARATUS AND METHOD OF MANUFACTURING THE SAME

(71) Applicant: Samsung Display Co., Ltd., Yongin, Gyeonggi-Do (KR)

(72) Inventors: Chang-Ho Lee, Yongin (KR); Jong-Hyun Park, Yongin (KR); Seong-Kweon Heo, Yongin (KR); Chun-Gi You, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 69 days.

(21) Appl. No.: 14/022,071

(22) Filed: Sep. 9, 2013

(65) Prior Publication Data

US 2014/0138646 A1 May 22, 2014

(30) Foreign Application Priority Data

Nov. 21, 2012 (KR) .................. 10-2012-0132605

(51) Int. Cl.
*H01L 29/08* (2006.01)
*H01L 21/00* (2006.01)
*H01L 51/52* (2006.01)
*H01L 51/56* (2006.01)

(52) U.S. Cl.
CPC ............... *H01L 51/52* (2013.01); *H01L 51/56* (2013.01)

(58) Field of Classification Search
CPC .................... H01L 23/544; H01L 29/66757
USPC .............................................. 257/40; 438/33
See application file for complete search history.

(56) References Cited

U.S. PATENT DOCUMENTS

| | | | |
|---|---|---|---|
| 7,910,919 B2 | 3/2011 | Yang et al. | |
| 2005/0161836 A1* | 7/2005 | Yudasaka et al. | 257/797 |
| 2005/0184359 A1* | 8/2005 | Akatsu et al. | 257/565 |
| 2006/0060858 A1* | 3/2006 | Park et al. | 257/66 |
| 2006/0232728 A1* | 10/2006 | Kim | 349/106 |
| 2008/0157099 A1* | 7/2008 | Yang et al. | 257/83 |
| 2009/0026932 A1* | 1/2009 | Kwak et al. | 313/504 |
| 2010/0073279 A1* | 3/2010 | Kwon et al. | 345/107 |

FOREIGN PATENT DOCUMENTS

| | | |
|---|---|---|
| KR | 10-2007-0087939 A | 8/2007 |
| KR | 10-0759578 B1 | 9/2007 |
| KR | 10-0788545 B1 | 12/2007 |

* cited by examiner

*Primary Examiner* — Trung Q Dang
*Assistant Examiner* — Patricia Reddington
(74) *Attorney, Agent, or Firm* — Lewis Roca Rothgerber Christie LLP (57) ABSTRACT

An organic light-emitting diode (OLED) display apparatus including a substrate, an insulation layer on the substrate, and an align mark formed of an insulation material, wherein an upper surface of the insulation layer contacts a lower surface of the align mark.

11 Claims, 9 Drawing Sheets

ORGANIC LIGHT-EMITTING DIODE DISPLAY APPARATUS AND METHOD OF MANUFACTURING THE SAME

RELATED APPLICATIONS

This application claims priority to and the benefit of Korean Patent Application No. 10-2012-0132605, filed on Nov. 21, 2012, in the Korean Intellectual Property Office, the disclosure of which is incorporated herein in its entirety by reference.

BACKGROUND

1. Field

One or more embodiments of the present invention relate to an organic light-emitting diode (OLED) display apparatus, and a method of manufacturing the same.

2. Description of the Related Art

An organic light-emitting diode (OLED) display apparatus includes OLEDs and circuit devices such as thin film transistors (TFTs) on a substrate. To form the circuit devices and light emitting diodes (LEDs), a patterning process such as a photolithographic process and an etching process may be used. An align mark may be used for accurate patterning. However, if a surface is damaged during a manufacturing process, the align mark may not be recognized in a subsequent process. For example, in a process of cutting a mother substrate to form a plurality of panels, the align mark may not be identified due to surface damage.

SUMMARY

One or more embodiments of the present invention include an organic light-emitting diode (OLED) display apparatus including an identifiable align mark.

One or more embodiments of the present invention include a method of manufacturing the OLED display apparatus including an identifiable align mark.

Additional aspects will be set forth in the description, which follows, and will be apparent from the description or may be learned by practice of the described embodiments.

According to one or more embodiments of the present invention, an organic light-emitting diode (OLED) display apparatus includes: a substrate; an insulation layer on the substrate; and an align mark including an insulation material. Here, an upper surface of the insulation layer contacts a lower surface of the align mark.

According to an embodiment of the present invention, the align mark includes an organic insulation material.

According to an embodiment of the present invention, the insulation layer directly contacts the lower surface of the align mark.

The insulation layer may include a lower insulation layer on the substrate and an upper insulation layer on the lower insulation layer, the OLED display apparatus may further include an auxiliary align mark between the lower insulation layer and the upper insulation layer, and the auxiliary align mark may be under the align mark and may correspond to the align mark.

The auxiliary align mark may include a semiconductor material, the lower insulation layer may include a buffer layer, and the upper insulation layer may include a gate insulation layer and an interlayer insulation layer on the gate insulation layer.

The auxiliary align mark may include a conductive material, the lower insulation layer may include a gate insulation layer, and the upper insulation layer may include an interlayer insulation layer.

The auxiliary align mark may have a stack structure including a transparent conductive material layer and a metal layer.

The OLED display apparatus may further include: a thin film transistor (TFT) on the substrate; a pixel electrode electrically connected to the TFT; a pixel defining layer exposing a part of the pixel electrode and defining a pixel; and an organic light-emitting layer, at least a part of which is on the part of the pixel electrode that is exposed by the pixel defining layer. Here, the pixel defining layer may include a same material as that of the insulation material of the align mark.

The TFT may include an active layer including a source region, a drain region, and a channel region between the source region and the drain region, and a gate electrode, at least a part of which overlaps with the channel region, and the insulation layer may include a gate insulation layer between the channel region of the active layer and the at least part of the gate electrode and an interlayer insulation layer on the gate insulation layer.

The substrate may include a display area where the TFT and the organic light-emitting layer are arranged, and an edge area at a periphery of the display area where the align mark is arranged.

The OLED display apparatus may further include a guard ring in the edge area of the substrate, along an edge of the edge area of the substrate, and in the insulation layer. Here, the align mark may be on the upper surface of the insulation layer on the guard ring.

The OLED display apparatus may further include a guard ring in the edge area of the substrate, along an edge of the edge area of the substrate, and in the insulation layer. Here, the align mark may be on the upper surface of the insulation layer between the guard ring and the display area.

The guard ring may be covered by the pixel defining layer.

According to an aspect of the present invention, there is provided a method of manufacturing an organic light-emitting diode (OLED) display apparatus, the method including: forming an insulation layer on a substrate; forming an align mark including an insulation material on the insulation layer such that a lower surface of the align mark contacts an upper surface of the insulation layer; and aligning the substrate by using the align mark.

The forming of the insulation layer may include: forming a lower insulation layer on the substrate; forming an auxiliary align mark on the lower insulation layer under the align mark to correspond to the align mark; and forming an upper insulation layer on the lower insulation layer to cover the auxiliary align mark.

The method may further include: forming a thin film transistor (TFT) on the substrate; forming a pixel electrode electrically connected to the TFT; and performing a patterning process to concurrently form a pixel defining layer and the align mark, the pixel defining layer defining a pixel and exposing a part of the pixel electrode.

The method may further include forming an organic light-emitting layer on the part of the pixel electrode of the substrate that is aligned by using the align mark.

The substrate may include a plurality of lower panels and a cutting line may be defined between the plurality of lower panels. The method may further include dividing the substrate into the plurality of lower panels by cutting along the cutting line of the substrate that is aligned by using the align mark.

Each of the plurality of lower panels may include the align mark, the method may further include: aligning the plurality of lower panels by using the align mark; and forming an organic light-emitting layer on the plurality of aligned lower panels.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made to embodiments of the present invention, examples of which are illustrated in the accompanying drawings, wherein like reference numerals refer to like elements throughout. In the drawings, the dimensions of structures may be exaggerated or reduced for clarity. In this regard, the present embodiments may have different forms and should not be construed as being limited to the descriptions set forth herein. Accordingly, the embodiments are merely described below, and illustrated in the figures, to explain aspects of the present invention.

The terms used in the description are used for explaining exemplary embodiments, and are not for limiting the present inventive concept. Thus, the expression of singularity in the present specification includes the expression of plurality, unless the context clearly indicates otherwise. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

The terms such as "first" and "second" are used herein merely to describe a variety of constituent elements, but the constituent elements are not limited by the terms. The terms are used only for the purpose of distinguishing one constituent element from another constituent element. For example, without departing from the scope of the present inventive concept, a first constituent element may be referred to as a second constituent element, and vice versa.

In the present specification, when an element "connects" or is "connected" to another element, the element may connect to the other element directly or through one or more additional elements. Also, when an element is described to "directly connect" or to be "directly connected" to another element, the element should be construed to be directly connected to another element without any other element interposed therebetween. Other expressions, such as, "between" and "directly between", describing the relationship between the constituent elements, may be construed in a similar manner.

Unless defined otherwise, all terms used herein, including technical or scientific terms, have the same meanings as those generally understood by those of ordinary skill in the art to which the present inventive concept may pertain. Additionally, the terms used herein that are defined in general use dictionaries are construed to have meanings matching those definitions in the context of the related technology and, unless clearly defined otherwise, are not construed to be ideally or excessively formal.

As used herein, the term "and/or" includes any and all combinations of one or more of the associated listed items. Expressions such as "at least one of," when preceding a list of elements, modify the entire list of elements and do not modify the individual elements of the list.

Figure 1:
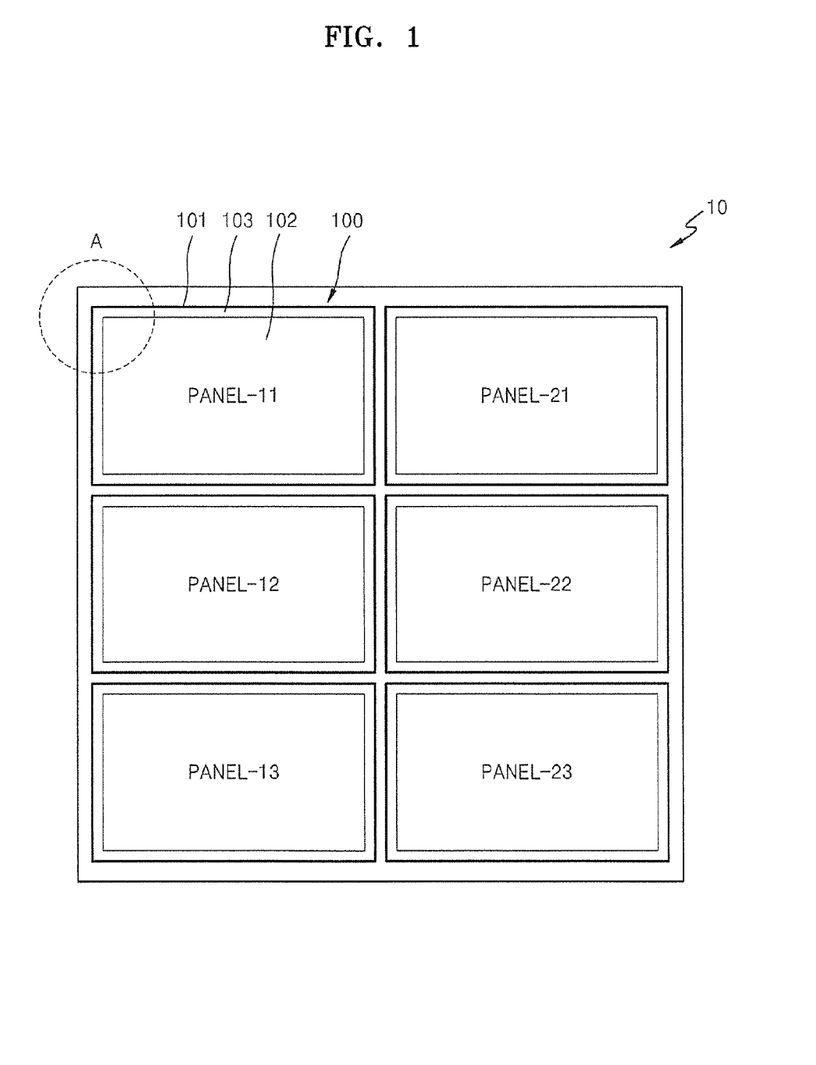
FIG. 1 is a plan view schematically illustrating a mother substrate for manufacturing an organic light-emitting diode (OLED) display apparatus.

FIG. 1 is a plan view schematically illustrating a mother substrate 10 for manufacturing an organic light-emitting diode (OLED) display apparatus. Referring to FIG. 1, the mother substrate 10 includes a plurality of OLED display panels 100.

The mother substrate 10 is used to manufacture a plurality of OLED display apparatuses at once. A plurality of panel areas is defined on the mother substrate 10. Cutting lines are defined between the panel areas. A cutting line may be referred to as a scribe line. The mother substrate 10 is separated (or divided) into the plurality of OLED display panels 100 by cutting the mother substrate 10 along the cutting lines. Each of the divided OLED display panels 100 may be used to manufacture a single OLED display apparatus. An OLED display apparatus may be completed by bonding an encapsulation member (not shown) onto each of the OLED display panels 100. The OLED display panels 100 each may be referred to as a lower panel.

In FIG. 1, a guard ring 101 may be formed at the outermost side of each of the OLED display panels 100. The guard ring 101 may be arranged at the outermost side of each of the OLED display panels 100 to extend along an edge (e.g., around the periphery) to protect a completed OLED display apparatus from external static electricity. The guard ring 101 of FIG. 1 may substantially define a panel area.

The panel areas are aligned in the form of a matrix, that is, in a row direction and a column direction, on the mother substrate 10. Although FIG. 1 illustrates a total of six panel areas defined on the mother substrate 10, this is exemplary and more or less panel areas may be defined.

The panel area may include a display area 102 and an edge area 103 surrounding (e.g., around the periphery of) the display area 102. The display area 102 is an area where elements, such as pixels, thin film transistors (TFTs), or wires, of the OLED display apparatus are arranged. The edge area 103 may be an area where pads that are connected to the wires are arranged.

As described above, the mother substrate 10 is cut along the cutting line, and thus, a cutting apparatus (not shown) and the mother substrate 10 are aligned with each other. To this end, an align mark may be formed on the mother substrate 10, for example, the align mark may be formed at an edge portion of the mother substrate 10. The align mark may be formed by using a pattern, (e.g., an inorganic pattern, for example, a metal pattern or a nitride pattern). The cutting apparatus may cut the mother substrate 10 along the cutting line by using the align mark formed in an inorganic pattern. However, the align mark may become damaged prior to cutting the mother substrate 10. As a result, the align mark may not be identified in the subsequent process. In this case, the cutting apparatus may not cut the mother substrate 10 along a desired cutting line.

For example, prior to cutting the mother substrate, a surface exposed by an etching process (such as a dry etch process, which is performed to form a contact penetrating, for example, an interlayer insulation layer) may be damaged. This surface damage may result in the align mark not being identified, and thus, in the subsequent cutting process, the cutting apparatus may not cut the mother substrate 10 along a desired cutting line.

FIGS. 2A through 2D are plan views schematically illustrating, in detail, a portion A of a mother substrate of FIG. 1 according to various embodiments of the present invention. Referring to FIGS. 2A through 2D, the display area 102 and the edge area 103 may be included in the panel area 105. The panel area 105 may be defined by a cutting line 104. The guard ring 101 may be arranged in the edge area 103.

As described above, the display area 102 is an area where an array of pixels may be arranged. Also, the wires extending in the row and column directions may be arranged between the pixels in the display area 102. Furthermore, TFTs electrically connecting the wires and the pixels may be arranged in the display area 102.

The edge area 103 may include mounting areas where drive chips are mounted or pads are arranged. Also, a bonding area to bond the lower panel and the encapsulation member may be arranged within the edge area 103.

As illustrated in FIGS. 2A through 2D, the guard ring 101 may be arranged at the outer portion of the edge area 103, or outside (e.g., just outside) the edge area 103. The guard ring 101 may be configured to be two lines as illustrated in FIGS. 2A through 2D, which is exemplary. However, the guard ring 101 may be otherwise configured; for example, the guard ring 101 may be configured to be in the form of one line or more than three lines. The guard ring 101 may be formed of a conductive material; for example, the guard ring 101 may be formed of the same material as that of a gate electrode of a TFT of the display area 102 or the same material as that of a wire connected to a source/drain.

In FIGS. 2A through 2D, a solid line for distinguishing the display area 102 from the edge area 103 is illustrated. However, the solid line may be an imaginary line that does not actually exist. Also, in FIGS. 2A through 2D, the cutting line 104 is illustrated by a two-dot dashed line outside the guard ring 101. The cutting line 104 may be also an imaginary line that does not actually exist.

The cutting line 104 may be a line defining the panel area 105. In other words, an inner area of the cutting line 104 may be defined to be the panel area 105.

To cut the mother substrate 10 along the cutting line 104, the mother substrate 10 and the cutting apparatus are aligned with each other. To this end, align marks 107a through 107d may be arranged on the mother substrate 10.

Figure 2A:
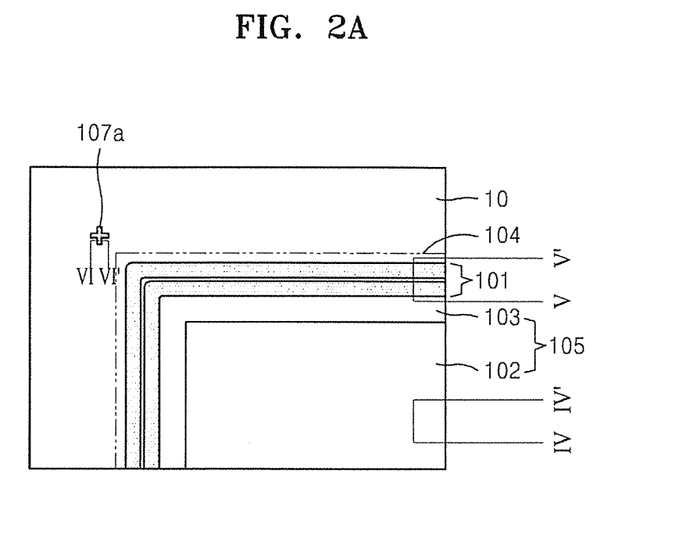
FIGS. 2A through 2D are plan views schematically illustrating, in detail, a portion A of a mother substrate of FIG. 1 according to various embodiments of the present invention.

As illustrated in FIG. 2A, the align mark 107a may be arranged at the edge portion of the mother substrate 10. The align mark 107a may be arranged outside the cutting line 104.

Figure 2B:
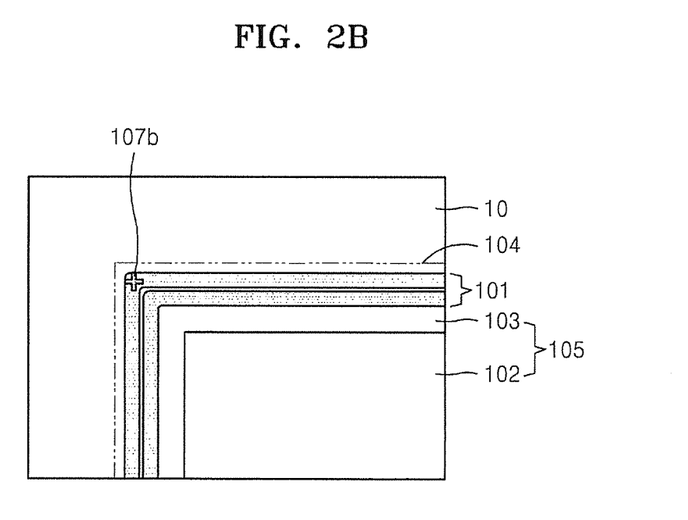

As illustrated in FIG. 2B, the align mark 107b may be arranged within the panel area 105. In detail, the align mark 107b may be arranged on the guard ring 101 of the edge area 103.

Figure 2C:
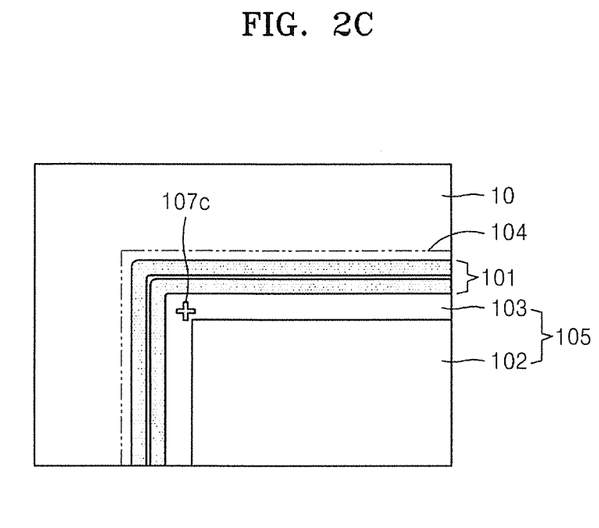

As illustrated in FIG. 2C, the align mark 107c may be arranged within the panel area 105. In detail, the align mark 107c may be arranged inside the guard ring 101 in the edge area 103.

Figure 2D:
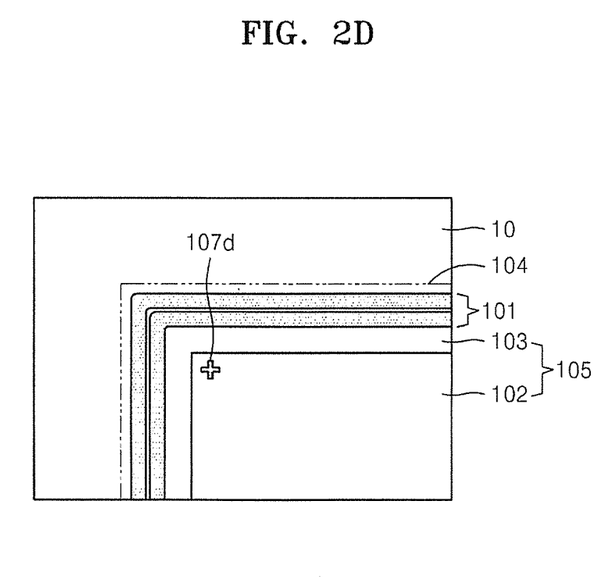

As illustrated in FIG. 2D, the align mark 107c may be arranged within the panel area 105. In detail, the align mark 107c may be arranged within the display area 102.

Although FIGS. 2A through 2D illustrate that the align marks 107a through 107d have a cross (+) shape, this shape is exemplary. Also, in the following description, the align marks 107a through 107d may be collectively referred to an align mark 107.

FIGS. 3A through 3D illustrate examples of plane views of shapes of align marks according to various embodiments of the present invention.

Figure 3A:
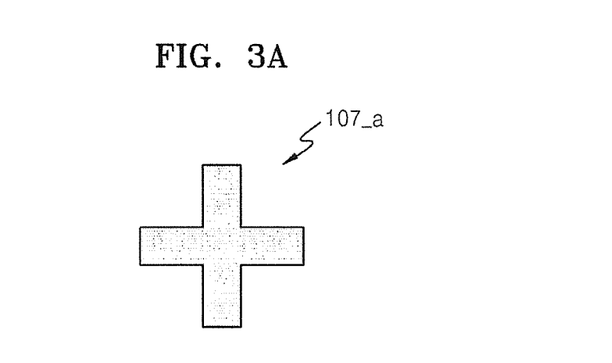
FIGS. 3A through 3D schematically illustrate examples of plane shapes of align marks according to various embodiments of the present invention.

As illustrated in FIG. 3A, an align mark 107_a may have a cross (+) shape.

Figure 3B:
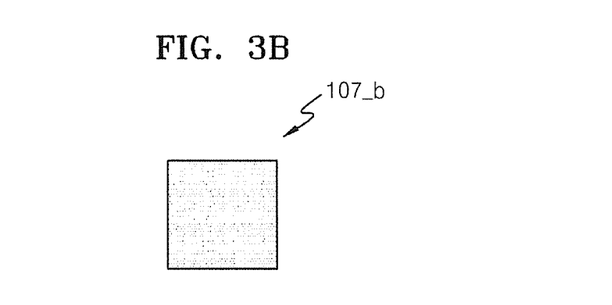

Also, as illustrated in FIG. 3B, an align mark 107_b may have a planar shape of a rectangle (■). In addition, the align mark may have a variety of shapes, for example, it may have the shape of a triangle, a hexagon, a polygon, a circle, an oval, etc.

Figure 3C:
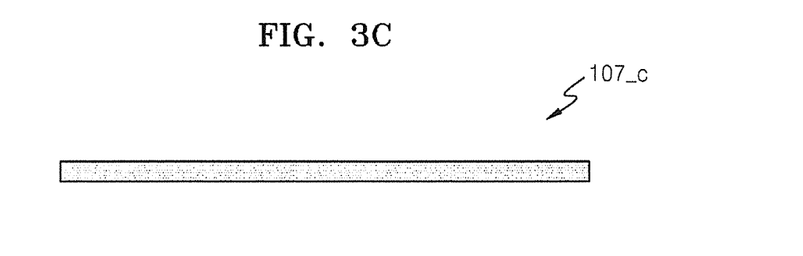

As illustrated in FIG. 3C, an align mark 107_c may be in the form of a line. In this case, the align mark 107_c may be arranged parallel to the cutting line 104. When the align mark 107a of FIG. 2A is in the form of a line, the align mark 107a may be arranged outside the cutting line 104 to be parallel to the cutting line 104. When the align mark 107b of FIG. 2B is in the form of a line, the align mark 107b may be arranged on the guard ring 101 to extend along the guard ring 101. When the align mark 107c of FIG. 2C is in the form of a line, the align mark 107c may be arranged inside the guard ring 101 to extend along the guard ring 101. When the align mark 107d of FIG. 2D is in the form of a line, the align mark 107d may be a line defining the display area 102 and the edge area 103 and may extend along the guard ring 101.

Figure 3D:
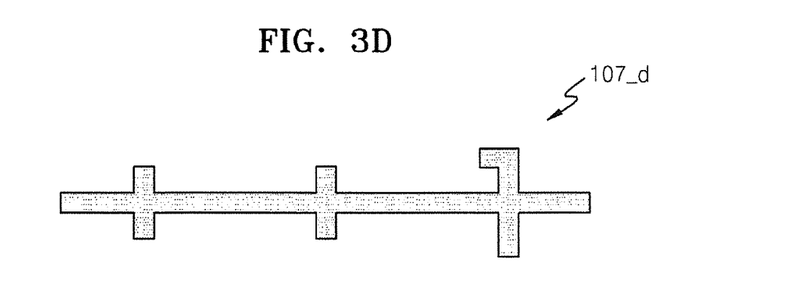

As illustrated in FIG. 3D, the align mark 107_d may have a modified linear shape. The align mark 107_d may further include auxiliary lines perpendicular to a main line, which is based on the align mark 107_c, that is in the form of a line.

Figure 4:
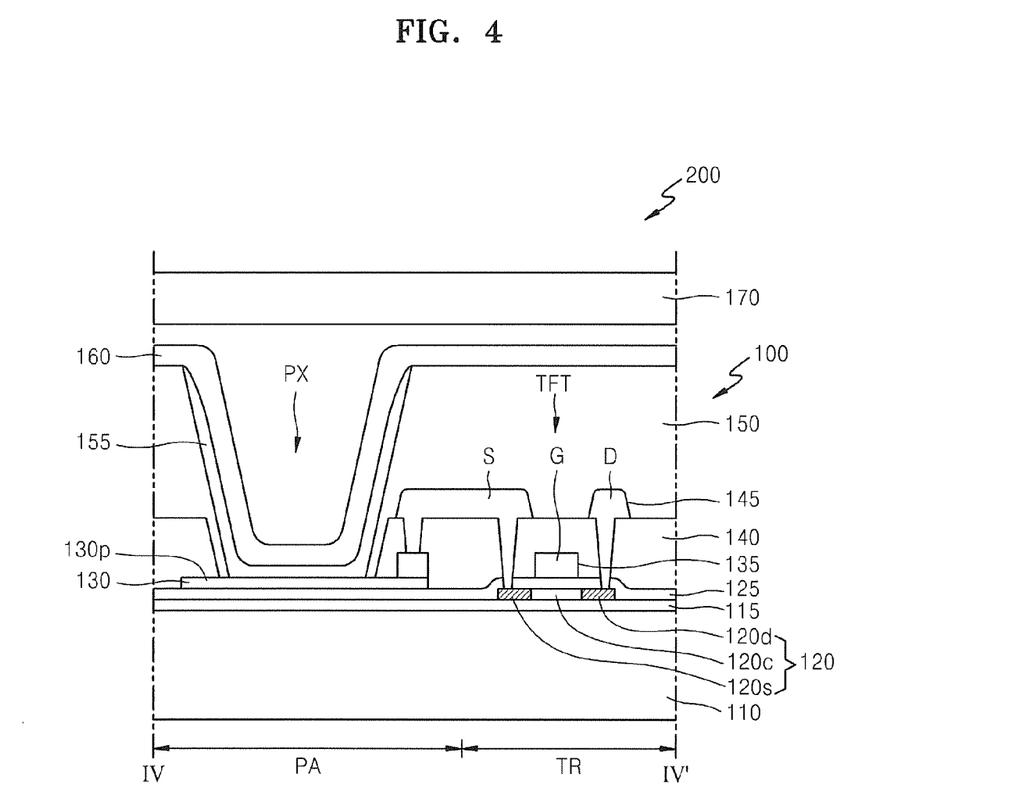
FIG. 4 is a cross-sectional view taken along the line IV-IV' of FIG. 2A, schematically illustrating a display area of an OLED display apparatus to which the align marks according to various embodiments of the present invention may be applied.

FIG. 4 is a schematic cross-sectional view taken along the line IV-IV' of FIG. 2A, illustrating a display area of an OLED display apparatus 200 to which the align marks according to various embodiments of the present invention may be applied. Referring to FIG. 4, the OLED display apparatus 200, according to the present embodiment, may include the lower panel 100 and an encapsulation member 170. The lower panel 100 includes a substrate 110, a light-emitting pixel PX, a thin-film-transistor (TFT), and a capacitor (not shown).

The substrate 110 may be defined as a plurality of areas, and may include a pixel area PA and a circuit area TR, as illustrated in FIG. 4. Although not illustrated in FIG. 4, a storage area where the capacitor is formed may be included on the substrate 110.

The pixel area PA may include a pixel electrode 130p, an organic layer 155 on the pixel electrode 130p, and a common electrode 160 on the organic layer 155. The organic layer 155 may emit light when a voltage is applied between the pixel electrode 130p and the common electrode 160.

The circuit area TR is an area where the light-emitting pixel (PX) transmits various electric signals for operation and may include TFTs.

The TFT may include an active layer 120, a gate electrode G, a source electrode S, and a drain electrode D. Also, the source electrode S may be connected to a source region 120s of the active layer 120 via a contact plug. The drain electrode D may be connected to a drain region 120d of the active layer 120 via a contact plug. Although FIG. 4 illustrates that the source electrode S is connected to the pixel electrode 130p, this is exemplary, and the drain electrode D may be connected to the pixel electrode 130p according to a conductivity type of the TFT.

The substrate 110 may be formed of a transparent glass material having silicon oxide as a main ingredient. The substrate 110 is not limited thereto and may be formed of, for example, a transparent plastic material. Also, the substrate 110 may have a flexible characteristic. The substrate 110 may be formed of a single organic material or by a combination of a plurality of organic materials.

A buffer layer 115 may be arranged on the substrate 110. The buffer layer 115 may prevent intrusion of impurity elements through the substrate 110 and provide a flat surface on the substrate 110. The buffer layer 115 may be formed of an inorganic material, such as silicon oxide, silicon nitride, silicon oxynitride, aluminum oxide, aluminum nitride, titanium oxide, or titanium nitride, or of an organic material such as polyimide, polyester, or acryl. Also, the buffer layer 115 may include a stack structure of a plurality of materials selected from the above-listed materials.

Although the buffer layer 115 of FIG. 4 is not patterned, the buffer layer 115 may be patterned according to another embodiment. For example, the buffer layer 115 under the pixel electrode 130p may be removed and the buffer layer 115 under the active layer 120 may remain. During patterning of the active layer 120, when an active layer material remains under the pixel electrode 130p, the active layer material may appear as dark spots. To prevent this from occurring, when the buffer layer 115 under the pixel electrode 130p is removed, the active layer material under the pixel electrode 130p may be completely removed.

The active layer 120 may be arranged within the circuit area TR on the buffer layer 115. The active layer 120 may include a silicon material such as amorphous silicon or polysilicon. Alternatively, the active layer 120 may include an oxide semiconductor material.

The active layer 120 includes the source region 120c, the drain region 120d, and a channel region 120c between the source region 120s and the drain region 120d. The source region 120s and the drain region 120d are regions doped with impurity ions and having conductivity. The channel region 120c may overlap with at least part of the gate electrode G. Although not illustrated in FIG. 4, the active layer 120 may include a part functioning as a capacitor's lower electrode in the storage area.

A gate insulation layer 125 may be arranged on the buffer layer 115 and the active layer 120. The gate insulation layer 125 may be formed of oxide, nitride, oxynitride, or a combination thereof. For example, the gate insulation layer 125 may have a stack structure of silicon oxide, silicon nitride, and silicon oxide.

A first conductive layer 130 may be arranged on the gate insulation layer 125. A part of the first conductive layer 130 arranged within the pixel area PA may be referred to as the pixel electrode 130p. The pixel electrode 130p may be referred to as a lower electrode or an anode electrode. The first conductive layer 130 may be formed of a transparent conductive material such as ITO, IZO, ZnO, $In_2O_3$, IGO or AZO.

A second conductive layer 135 may be arranged on a part of the pixel electrode 130p and on the gate insulation layer 125 corresponding to the channel region 120c. The second conductive layer 135 arranged on a part of the pixel electrode 130p may reduce contact resistance between a third conductive layer 145 and the first conductive layer 130. The second conductive layer 135 arranged on the gate insulation layer 125 corresponding to the channel region 120c is the gate electrode G.

The second conductive layer 135 may be formed of metal or a metal alloy such as Mo, MoW, or an Al-based alloy, but is not limited thereto. Also, the second conductive layer 135 may have a stack structure of Mo/Al/Mo. Although it is not illustrated in FIG. 4, the first conductive layer 130 may be interposed between the gate insulation layer 125 and the gate electrode G.

An interlayer insulation layer 140 may be arranged on the gate insulation layer 125, the first conductive layer 130, and the second conductive layer 135. The interlayer insulation layer 140 may include an opening portion exposing at least a part of the pixel electrode 130p. Also, the interlayer insulation layer 140 may include an opening portion exposing an upper surface of the second conductive layer 135 in the pixel area PA. The interlayer insulation layer 140 and the gate insulation layer 125 may include opening portions exposing parts of the source region 120s and the drain region 120d.

The interlayer insulation layer 140 may be formed of various insulation materials, for example, inorganic materials such as oxide, nitride, or oxynitride.

The third conductive layer 145 may be formed on the interlayer insulation layer 140. The third conductive layer 145 may fill the opening portion that exposes the upper surface of the second conductive layer 135 in the pixel area PA. Also, the third conductive layer 145 may fill the opening portions that expose parts of the source region 120s and the drain region 120d.

The third conductive layer 145 may electrically connect the pixel electrode 130p and the source region 120s. Also, the third conductive layer 145 may be electrically connected to the drain region 120d. A part of the third conductive layer 145 electrically connected to the source region 120s may be referred to as the source electrode S. A part of the third conductive layer 145 electrically connected to the drain region 120d may be referred to as the drain electrode D.

The third conductive layer 145 may be formed of metal such as Au, Pd, Pt, Ni, Rh, Ru, Ir, Os, Al, Mo, Nd, Mo, or W, or an alloy of two or more metals.

A pixel defining layer 150 may be arranged exposing a part of the pixel electrode 130p and covering the third conductive layer 145 on the interlayer insulation layer 140. The pixel defining layer 150 may define a pixel in the pixel area PA.

The pixel defining layer 150 may be formed of an organic insulation material. For example, the pixel defining layer 150 may be formed of a material selected from the group consisting of polyacrylates resin, epoxy resin, phenolic resin, polyamides resin, polyimides rein, unsaturated polyesters resin, poly(phenylenethers) resin, poly(phenylenesulfides) resin, benzocyclobutene (BCB), and any mixtures thereof.

An organic layer 155 is arranged on the pixel electrode 130p that is exposed by the pixel defining layer 150. The organic layer 155 may be formed of a low molecular weight organic layer or a polymer organic layer. When the organic layer 155 is formed of a low molecular weight organic layer, the organic layer 155 may include a hole injection layer (HIL), a hole transport layer (HTL), an emissive layer (EML), an electron transport layer (ETL), and an electron injection layer (EIL).

The HIL may be formed of a phthalocyanine compound such as copper phthalocyanine (CuPc), or a starburst amine type material such as TCTA, m-MTDATA, or m-MTDAPB. The HTL may be formed of N,N'-bis(3-methylphenyl)-N,N'-diphenyl-[1,1-biphenyl]-4,4'-diamine(TPD) or N,N'-di(naphthalene-1-yl)-N,N'-diphenylbenzidine (α-NPD). The EIL may be formed of a material such as LiF, NaCl, CsF, $Li_2O$, BaO, or Liq. The ETL may be formed of tris-8-hydroxyquinoline aluminum (Alq3). The organic layer 155 may include a host material and a dopant material.

The common electrode 160 may be formed on the organic layer 155 and the pixel defining layer 150. The common electrode 160 may be formed of metal such as Ag, Mg, Al, Pt, Pd, Au, Ni, Nd, Ir, Cr, Li, or Ca. The common electrode 160 may be formed of a transmissive conductive material such as ITO, IZO, ZnO, or $In_2O_3$, to enable light transmission. The common electrode 160 may be referred to as an upper electrode or a cathode electrode.

The encapsulation member 170 may be arranged on the common electrode 160. The encapsulation member 170 may be formed of an organic material or an inorganic material. The encapsulation member 170 may be attached to each of the OLED display panels 100 by using a bonding member, for example, a sealant or frit.

The OLED display apparatus of FIG. 4 is provided as an example to which the aspects of the present invention may be applied; however, the aspects of the present invention may be applied to an OLED display apparatus having a different structure from that of the OLED display apparatus of FIG. 4. The OLED display apparatus of FIG. 4 is provided for easy understanding of the present invention and the scope of the present invention is not limited thereto.

Figure 5A:
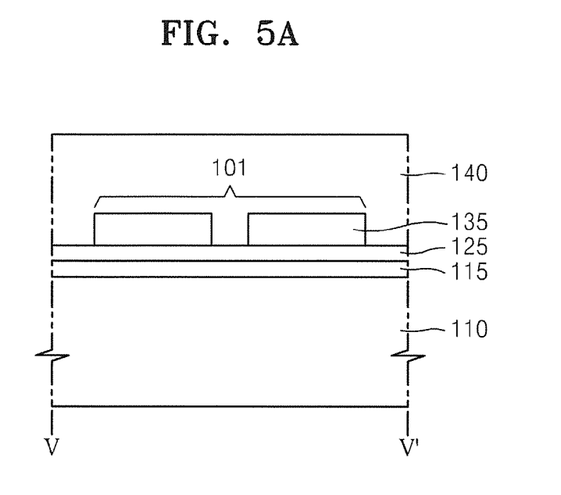
FIGS. 5A and 5B are schematic cross-sectional views taken along the line V-V' of FIG. 2A, illustrating a guard ring of an OLED display apparatus to which the align marks according to various embodiments of the present invention may be applied.
Figure 5B:
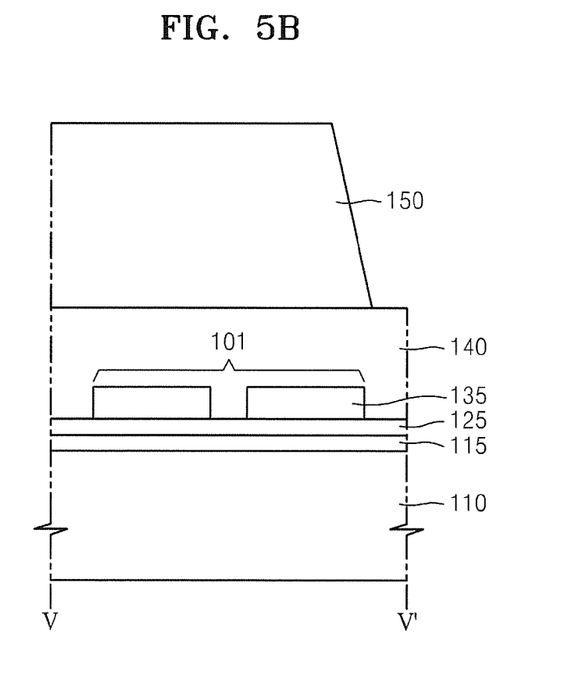

FIGS. 5A and 5B are cross-sectional views taken along the line V-V' of FIG. 2A, illustrating a guard ring of an OLED display apparatus to which the align marks according to various embodiments of the present invention may be applied. Referring to FIG. 5A, the guard ring 101 formed at the second conductive layer 135 is illustrated. The guard ring 101 may be formed by patterning the second conductive layer 135.

The guard ring 101 may be formed of metal or a metal alloy such as Mo, MoW, or an Al-based alloy, as a conductive material. Also, the guard ring 101 may have a stack structure of Mo/Al/Mo.

Referring to FIG. 5B, the pixel defining layer 150 may be arranged above the guard ring 101. As the pixel defining layer 150 extends to an area over the guard ring 101 arranged in the edge area 103, damage to the upper surface of the interlayer insulation layer 140 above the guard ring 101 during the subsequent process may be prevented.

If the guard ring 101 is arranged on the interlayer insulation layer 140 by using the third conductive layer 145 of FIG. 4, the guard ring 101 on the interlayer insulation layer 140 may be exposed to air and may be damaged by oxygen. To prevent this damage, the guard ring 101 on the interlayer insulation layer 140 may be covered by the pixel defining layer 150, however air bubbles may be generated in an interface between the guard ring 101 formed of a metal material and the pixel defining layer 150 formed of an organic insulation material. The air bubbles may facilitate formation of a moisture intrusion path.

Thus, the guard ring 101 according to the present embodiment may be formed by using the second conductive layer 135.

Although not illustrated in FIGS. 5A and 5B, the guard ring 101 may have a stack structure of the first conductive layer 130 and the second conductive layer 135 according to a manufacturing process.

Although the encapsulation member 170 is not illustrated in FIGS. 5A and 5B for convenience of explanation, one of ordinary skill in the art should understand that the encapsulation member 170 may be arranged above the guard ring 101.

FIGS. 6A through 6D are cross-sectional views taken along the line VI-VI' of FIG. 2A, illustrating a display area of an OLED display apparatus to which the align marks according to various embodiments of the present invention may be applied.

Figure 6A:
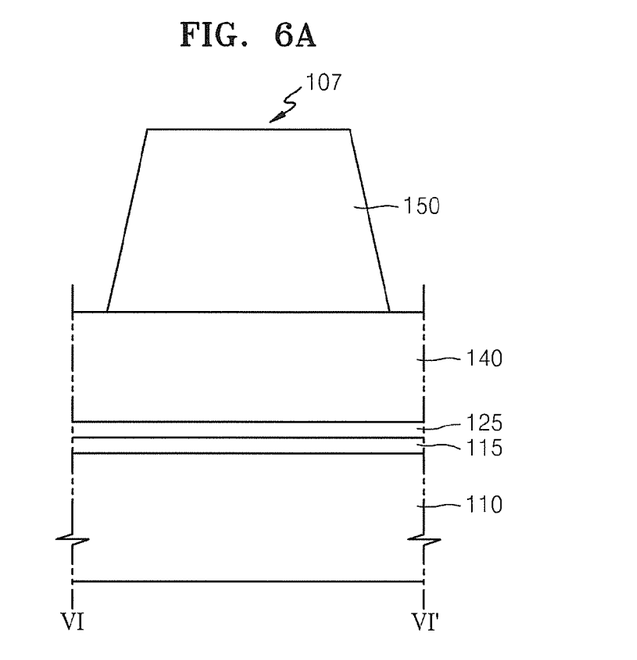
FIGS. 6A through 6D are schematic cross-sectional views taken along the line VI-VI' of FIG. 2A, illustrating a display area of an OLED display apparatus to which the align marks according to various embodiments of the present invention may be applied.

Referring to FIG. 6A, the align mark 107 formed of the pixel defining layer 150 is illustrated. According to an embodiment of the present invention, the align mark 107 may be arranged on an insulation layer of a stack structure in which the buffer layer 115, the gate insulation layer 125, and the interlayer insulation layer 140 are sequentially stacked on the substrate 110. As illustrated the embodiment of the present invention shown in FIG. 6A, a conductive layer is not arranged between the align mark 107 and the interlayer insulation layer 140, and a lower surface of the align mark 107 and an upper surface of the interlayer insulation layer 140 directly contact each other.

The insulation layer of the stack structure may further include a planarization layer (not shown) on the interlayer insulation layer 140. The planarization layer may be an inorganic insulation layer or an organic insulation layer. In this case, the align mark 107 formed of the pixel defining layer 150 may be arranged directly on the planarization layer.

When the align mark 107 is formed of the pixel defining layer 150, an alignment apparatus (not shown) may recognize the align mark 107 by using a reflection characteristic of the pixel defining layer 150. Also, the alignment apparatus may recognize the align mark 107 by using a step (e.g., a step-difference) between the align mark 107 and the interlayer insulation layer 140. Thus, the align mark 107 formed under the interlayer insulation layer 140 is recognized even if the upper surface of the interlayer insulation layer 140 is damaged.

Figure 6B:
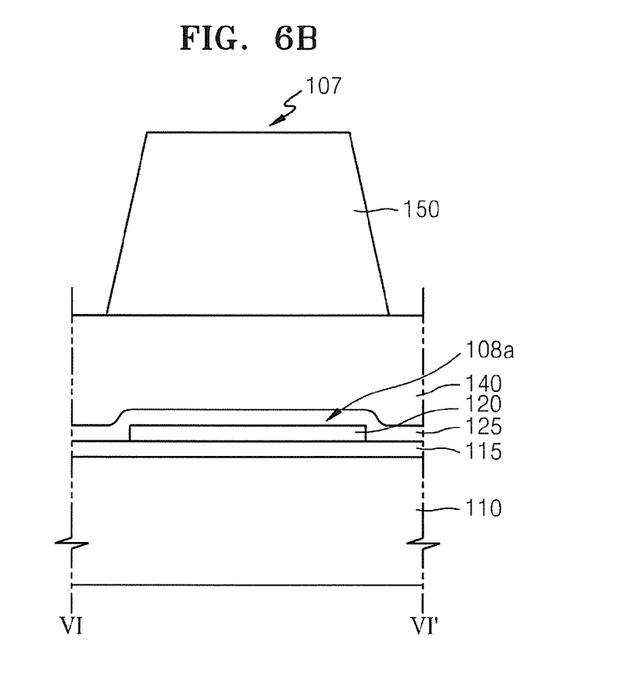

Referring to FIG. 6B, an auxiliary align mark 108a is further formed under the align mark 107. The auxiliary align mark 108a may be arranged between the buffer layer 115 and the gate insulation layer 125. The auxiliary align mark 108a may be formed as the active layer 120. In other words, the auxiliary align mark 108a may be formed by patterning the active layer 120.

The auxiliary align mark 108a may correspond to the align mark 107. For example, the auxiliary align mark 108a may have a shape corresponding to the shape of the align mark 107, and may have a size corresponding to the size of the align mark 107.

Figure 6C:
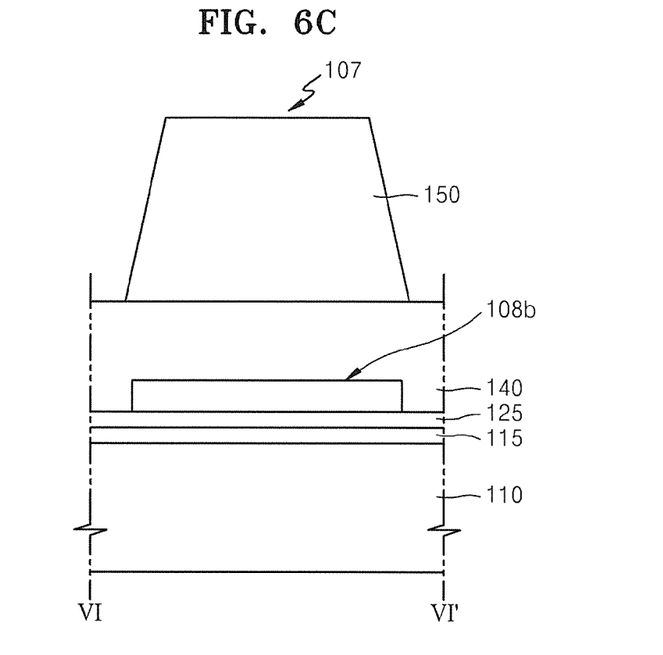

Referring to FIG. 6C, an auxiliary align mark 108b may be further formed under the align mark 107. The auxiliary align mark 108b may be arranged between the gate insulation layer 125 and the interlayer insulation layer 140. The auxiliary align mark 108b may be formed of the second conductive layer 135. In other words, the auxiliary align mark 108b may be formed by patterning the second conductive layer 135. The auxiliary align mark 108b may correspond to the align mark 107.

Figure 6D:
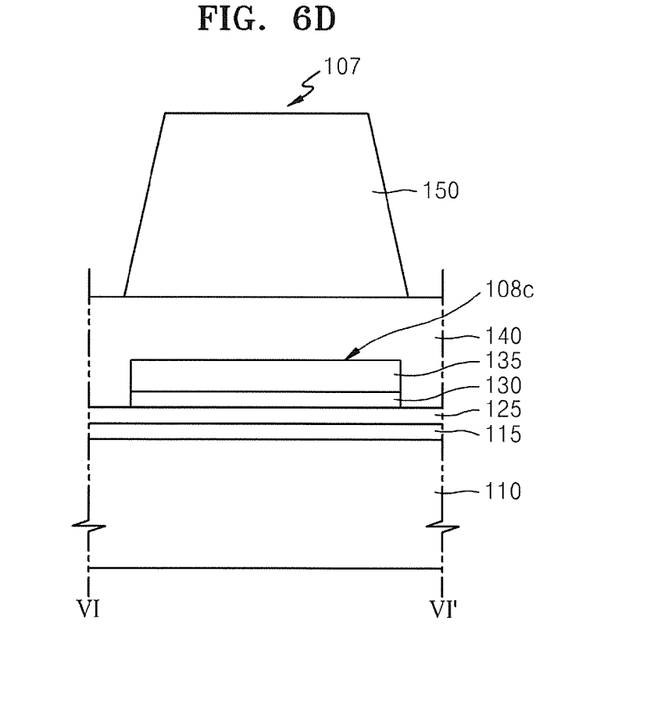

Referring to FIG. 6D, an auxiliary align mark 108c may be further formed under the align mark 107. The auxiliary align mark 108c may be arranged between the gate insulation layer 125 and the interlayer insulation layer 140. The auxiliary align mark 108c may have a stack structure of the first conductive layer 130 and the second conductive layer 135. In other words, the auxiliary align mark 108c may be formed by patterning the stack structure of the first conductive layer 130 and the second conductive layer 135. The auxiliary align mark 108c may correspond to the align mark 107.

The auxiliary align marks 108a, 108b, and 108c may be provided for easy recognition of an alignment mark by the alignment apparatus. The auxiliary align marks 108a, 108b, and 108c may have different colors from the colors of the stack structure of the substrate 110, the buffer layer 115, the gate insulation layer 125, and the interlayer insulation layer 140 therearound. Thus, the alignment apparatus may recognize the auxiliary align marks 108a, 108b, and 108c by using different colors.

Figure 7:
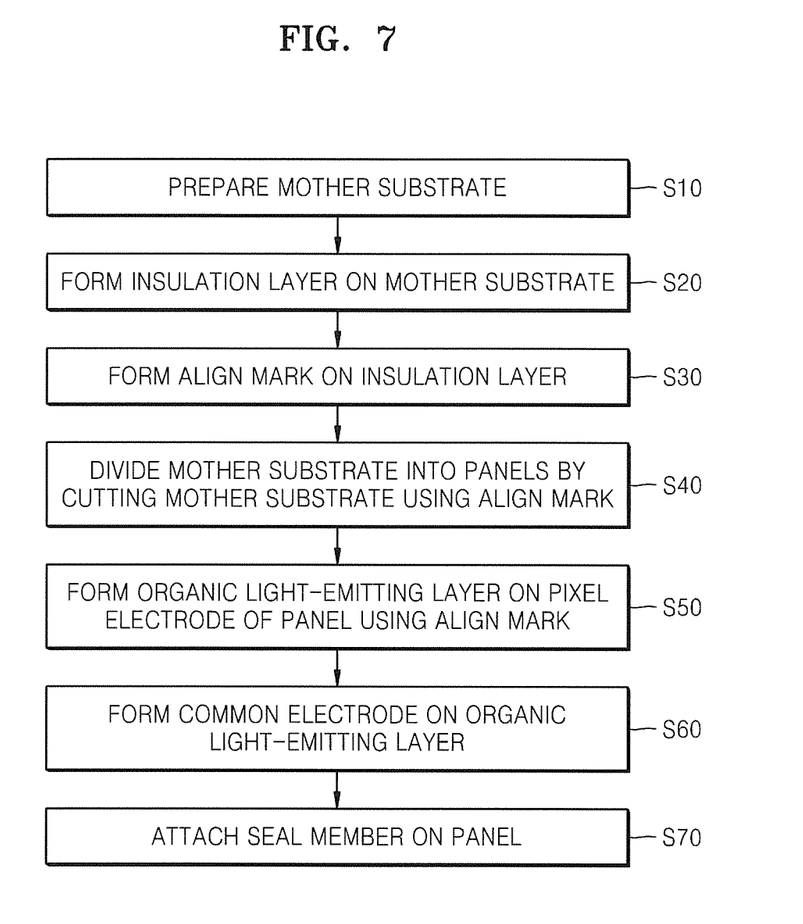
FIG. 7 is a flowchart for explaining a method of manufacturing an OLED display apparatus according to various embodiments of the present invention.

FIG. 7 is a flowchart for explaining a method of manufacturing an OLED display apparatus according to various embodiments of the present invention.

Referring to FIG. 7, the mother substrate 10 may be prepared (S10). The mother substrate 10 is illustrated in FIG. 1, and the OLED display panels 100 and the cutting line 104 between the OLED display panels 100 may be defined thereon.

An insulation layer may be formed on the mother substrate 10 (S20). The insulation layer may include the buffer layer 115, the gate insulation layer 125, and the interlayer insulation layer 140 of FIG. 4. The insulation layer may include the planarization layer on the interlayer insulation layer 140.

The forming of the insulation layer may include both the forming of the pixel electrode 130p and the forming of a TFT on the mother substrate 10. The TFT and the pixel electrode 130p of FIG. 4 may be formed, for example, by the following processes. The following process order is exemplary and the present invention is not limited thereto. The forming of the insulation layer is described below with reference to FIG. 4.

The buffer layer 115 may be formed on the mother substrate 10. The buffer layer 115 may be formed by a variety of deposition methods such as a plasma enhanced chemical vapor deposition (PECVD) method, an atmospheric pressure CVD (APCVD) method, or a low pressure CVD (LPCVD) method by using an inorganic insulation material, such as silicon oxide, silicon nitride, and/or silicon oxynitride.

A semiconductor material layer, which is to function as the active layer 120 of the TFT, may be formed on the buffer layer 115. The semiconductor material layer may be, for example, an amorphous silicon layer. The amorphous silicon layer may be patterned into a pattern of the active layer 120 by using a photolithographic process and an etching process by using a first mask (not shown). The patterned amorphous silicon layer may be crystallized, and thus, the active layer 120 formed of a polysilicon layer may be formed. The patterned amorphous silicon layer may be crystallized by using a variety of methods such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. According to another embodiment, the amorphous silicon layer is crystallized into a polysilicon layer and the polysilicon layer may be patterned by using the first mask.

While the active layer 120 is formed, the auxiliary align mark 108a of FIG. 6B formed of the active layer 120 may be formed (e.g., formed concurrently or simultaneously).

The gate insulation layer 125 may be formed on the buffer layer 115 and the active layer 120. The gate insulation layer 125 may be formed of oxide, nitride, oxynitride, or a combination thereof. For example, the gate insulation layer 125 may have a stack structure of lower silicon oxide, silicon nitride, and upper silicon oxide. The gate insulation layer 125 may be deposited by a deposition process, such as the PECVD method, the APCVD method, or the LPCVD method.

The first conductive layer 130 may be formed on the gate insulation layer 125. The first conductive layer 130 may include one or more materials selected from transparent conductive materials such as ITO, IZO, ZnO, or $In_2O_3$. The first conductive layer 130 may be patterned into the pixel electrode 130p by a photolithographic process and an etching process by using a second mask (not shown).

To form the auxiliary align mark 108c of FIG. 6D having the stack structure of the first conductive layer 130 and the second conductive layer 134, the first conductive layer 130 may be patterned into a lower conductive layer of the auxiliary align mark 108c.

The second conductive layer 135 may be formed on the gate insulation layer 125 and the first conductive layer 130. The second conductive layer 135 may include one or more materials selected from, for example, Ag, Mg, Al, Pt, Pd, Au, Ni, Nd, Ir, Cr, Li, Ca, Mo, Ti, W, MoW, and Al/Cu. For example, the second conductive layer 135 may be formed of a triple-layer structure of Mo—Al—Mo.

The second conductive layer 135 may be patterned into a pixel electrode contact and the gate electrode G by a photolithographic process and an etching process by using a third mask (not shown). Also, the second conductive layer 135 may be patterned into the guard ring 101 in the patterning operation. Additionally, the second conductive layer 135 may be patterned into the auxiliary align mark 108b of FIG. 6C.

The channel region 120c, the source region 120s, and the drain region 120d may be formed by doping n-type or p-type impurities in the active layer 120 by using the gate electrode G as a self-align mask.

The interlayer insulation layer 140 may be formed on the gate insulation layer 125, the first conductive layer 130, and the second conductive layer 135. The interlayer insulation layer 140 may include an inorganic insulation material such as silicon oxide, silicon nitride, or silicon oxynitride. The interlayer insulation layer 140 may be deposited by using a deposition process such as the PECVD method, the APCVD method, or the LPCVD method.

The interlayer insulation layer 140 may be patterned by a photolithographic process and an etching process by using a fourth mask (not shown), and thus, the opening portion for exposing the pixel electrode 130p, the opening portion for exposing the second conductive layer 135 on the pixel electrode 130p, and the opening portions for exposing the source regions 120s and the drain regions 120d are formed. The upper surface of the interlayer insulation layer 140 may be damaged by the patterning process.

The third conductive layer 145 may be formed on the interlayer insulation layer 140. The third conductive layer 145 may fill the opening portions in the interlayer insulation layer. The third conductive layer 145 may be patterned by a photolithographic process and an etching process using a fifth mask (not shown), as illustrated in FIG. 4. The third conductive layer 145 may expose the pixel electrode 130p.

The pixel defining layer 150 may be formed on the pixel electrode 130p, the interlayer insulation layer 140, and the third conductive layer 145. The pixel defining layer 150 may be formed of one or more organic insulation materials selected from the group consisting of polyimide, polyamide, acryl resin, benzocyclobutene, and phenol resin, by, for example, using a spin coating method. The pixel defining layer 150 may be patterned to expose the upper surface of the pixel electrode 130p by, for example, a photolithographic process and an etching process by using a sixth mask (not shown).

The align mark 107 of FIGS. 6A through 6D may be formed in the patterning process of the pixel defining layer 150 by using the sixth mask (S30). Also, in the patterning process using the sixth mask, the pixel defining layer 150 may be patterned to be arranged on the guard ring 101 as illustrated in FIG. 5B.

The mother substrate 10 may be divided into a plurality of the OLED display panels 100 (S40). To this end, the alignment apparatus may align the mother substrate 10 by recognizing the align mark 107 (or the align mark 107 and the auxiliary align mark 108a, b, or c) of the mother substrate 10. Then, the cutting apparatus may cut the mother substrate 10 along the cutting line 104. As described above, the cutting line 104 may be an imaginary line that is recognized relative to the align mark 107.

The organic layer 155 may be formed (e.g., formed thereafter) on the pixel electrode 130p of each of the OLED display panels 100 (S50). The align mark 107 may be used to align an organic deposition apparatus (not shown) and each of the OLED display panels 100. The alignment apparatus may align each of the OLED display panels 100 by recognizing the align mark 107 of each of the OLED display panels 100. The organic deposition apparatus may obtain the position of the pixel electrode 130p of each of the OLED display panels 100 aligned by the alignment apparatus and form the organic layer 155 by depositing an organic material on the pixel electrode 130p.

The organic layer 155 may be formed, for example, by stacking at least one of the layers of the HTL, the HIL, the ETL, and the EIL in addition to the EML, in a single or combined structure thereof. The organic layer 155 may be formed of a low molecular organic material or a polymer organic material.

When the organic layer 155 is formed of a low molecular organic material, the HIL, the HTL, the EML, the ETL, and the EIL may be sequentially stacked between the pixel electrode 130p and the common electrode 160. A variety of organic materials, such as CuPc, N,N'-Di(naphthalene-1-yl)-N,N'-diphenyl-benzidine (NPB), or Alq3, may be used as a usable organic material.

When the organic layer 155 is formed of a polymer organic material, the organic layer 155 may include only the HTL in a direction along the pixel electrode 130p with respect to the organic light-emitting layer. The HTL may be formed in an upper portion of the pixel electrode 130p by an inkjet printing method or a spin coating method, using poly-(3,4)-ethylenedihydroxy thiophene (PEDOT) or polyaniline (PANI). A usable organic material may be a polymer organic material such as a poly-phenylenevinylene (PPV) based material and a polyfluorene based material. A color pattern may be formed by a common method such as an inkjet printing method, a spin coating method, or a thermal transfer method using a laser.

The common electrode 160 may be formed on the display area 102 of each of the OLED display panels 100 (S60). The common electrode 160 may be formed on the entire surface of each of the OLED display panels 100. In this case, the common electrode 160 may be formed on the guard ring 101 and the align mark 107.

The encapsulation member 170 may be attached on each of the OLED display panels 100 (S70). The encapsulation member 170 may be bonded to the substrate 110 by using a bonding member (not shown). The bonding member may be arranged between the guard ring 101 and the display area 102.

When the align mark 107 is arranged between the guard ring 101 and the display area 102, a step may be formed on a surface between the guard ring 101 and the display area 102 due to the align mark 107. The bonding member may strongly bond each of the OLED display panels 100 and the encapsulation member 170 due to the step.

Although, in the above-described embodiment, the OLED display apparatus 200 is described as an example, the present invention is not limited thereto and may be applied to a variety of display apparatuses.

Also, although, in the accompanying drawings, only one TFT is illustrated to explain the present embodiment, this is merely for convenience of explanation and the present invention is not limited thereto. Also, the OLED display apparatus according to the present invention may include a plurality of TFTs and one or more capacitors.

As described above, in the OLED display apparatus and the method of manufacturing the OLED display apparatus according to the one or more of the above embodiments of the present invention, because the align mark is formed by using the pixel defining layer, the phenomenon where the align mark is not recognized may be solved. As a result, more accurate patterning is possible. Thus, a manufacturing yield may be improved.

It should be understood that the exemplary embodiments described herein should be considered in a descriptive sense only and not for purposes of limitation. Descriptions of features or aspects within each embodiment should typically be considered as available for other similar features or aspects in other embodiments. Accordingly, it will be understood by those of ordinary skill in the art that various changes in form and details may be made to the embodiments of the present invention without departing from the spirit and scope of the present invention as defined by the following claims and their equivalents.

What is claimed is:

1. An organic light-emitting diode (OLED) display apparatus comprising:
    a substrate;
    a thin film transistor (TFT) on the substrate;
    an insulation layer on the substrate;
    a pixel electrode on the insulation layer, the pixel electrode being electrically connected to the TFT;
    an organic insulation material layer comprising:
        an align mark as a part of the organic insulation material layer; and
        a pixel defining layer as another part of the organic insulation material layer, the pixel defining layer exposing a part of the pixel electrode and defining a pixel; and
    an organic light-emitting layer, at least a part of which is on the part of the pixel electrode that is exposed by the pixel defining layer,
    wherein an upper surface of the insulation layer directly contacts a lower surface of the align mark.

2. The OLED display apparatus of claim 1,
    wherein the insulation layer comprises a lower insulation layer on the substrate and an upper insulation layer on the lower insulation layer,
    wherein the OLED display apparatus further comprises an auxiliary align mark between the lower insulation layer and the upper insulation layer, and
    wherein the auxiliary align mark is under the align mark and corresponds to the align mark.

3. The OLED display apparatus of claim 2,
    wherein the auxiliary align mark comprises a semiconductor material, wherein the lower insulation layer comprises a buffer layer, and
wherein the upper insulation layer comprises a gate insulation layer and an interlayer insulation layer on the gate insulation layer.

4. The OLED display apparatus of claim 2,
wherein the auxiliary align mark comprises a conductive material,
wherein the lower insulation layer comprises a gate insulation layer, and
wherein the upper insulation layer comprises an interlayer insulation layer.

5. The OLED display apparatus of claim 4,
wherein the auxiliary align mark has a stack structure comprising a transparent conductive material layer and a metal layer.

6. The OLED display apparatus of claim 1,
wherein the pixel defining layer comprises a same material as that of the organic insulation material of the align mark.

7. The OLED display apparatus of claim 1,
wherein the TFT comprises an active layer comprising a source region, a drain region, and a channel region between the source region and the drain region, and a gate electrode, at least a part of which overlaps with the channel region, and
wherein the insulation layer comprises a gate insulation layer between the channel region of the active layer and the at least part of the gate electrode and an interlayer insulation layer on the gate insulation layer.

8. The OLED display apparatus of claim 1,
wherein the substrate comprises: a display area where the TFT and the organic light-emitting layer are arranged, and an edge area at a periphery of the display area where the align mark is arranged.

9. The OLED display apparatus of claim 8, further comprising a guard ring in the edge area of the substrate, along an edge of the edge area of the substrate, and in the insulation layer,
wherein the align mark is on the upper surface of the insulation layer on the guard ring.

10. The OLED display apparatus of claim 8, further comprising a guard ring in the edge area of the substrate, along an edge of the edge area of the substrate, and in the insulation layer,
wherein the align mark is on the upper surface of the insulation layer between the guard ring and the display area.

11. The OLED display apparatus of claim 10, wherein the guard ring is covered by the pixel defining layer.

* * * * *